United States Patent
Furukawa et al.

(10) Patent No.: US 7,585,614 B2
(45) Date of Patent: Sep. 8, 2009

(54) SUB-LITHOGRAPHIC IMAGING TECHNIQUES AND PROCESSES

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Peter H. Mitchell, Jericho, VT (US); Larry A. Nesbit, Williston, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 781 days.

(21) Appl. No.: 10/711,458

(22) Filed: Sep. 20, 2004

(65) Prior Publication Data

US 2006/0060562 A1 Mar. 23, 2006

(51) Int. Cl.
*G03F 7/00* (2006.01)
(52) U.S. Cl. .................. 430/311; 430/302; 430/314; 430/315; 216/41
(58) Field of Classification Search .......... 430/311, 430/314, 302, 315, 320; 438/954; 216/41, 216/58, 48
See application file for complete search history.

(56) References Cited

U.S. PATENT DOCUMENTS

| 5,328,810 | A |  | 7/1994 | Lowrey et al. |
| 5,714,039 | A |  | 2/1998 | Beilstein, Jr. et al. |
| 6,114,082 | A |  | 9/2000 | Hakey et al. |
| 6,136,679 | A | * | 10/2000 | Yu et al. ............. 438/592 |
| 6,291,137 | B1 |  | 9/2001 | Lyons et al. |
| 6,319,083 | B1 | * | 11/2001 | Alwan ............. 445/24 |
| 6,372,412 | B1 |  | 4/2002 | Hakey et al. |
| 2001/0003034 | A1 |  | 6/2001 | Furukawa et al. |
| 2003/0203319 | A1 | * | 10/2003 | Lee ............. 430/314 |

* cited by examiner

*Primary Examiner*—Thorl Chea
(74) *Attorney, Agent, or Firm*—Richard Kotulak; Greenblum & Bernstein P.L.C.

(57) ABSTRACT

A method of patterning which provides images substantially smaller than that possible by lithographic techniques is provided. In the method of the invention, a substrate has a memory layer and a sacrificial layer formed thereon. An image is patterned onto the memory layer by protecting an edge during an etching step using chemical oxide removal (COR) processes, for example. Another edge is memorized in the layer. The sacrificial layer is removed to expose another memorized edge, which is used to define a pattern in an underlying layer.

20 Claims, 7 Drawing Sheets

SUB-LITHOGRAPHIC IMAGING TECHNIQUES AND PROCESSES

BACKGROUND OF THE INVENTION

1. Field of the Invention

The invention relates to image patterning techniques and more particularly to subtractive imaging techniques, which are defect insensitive and highly repeatable.

2. Background Description

Traditional optical lithography has been used for years to image and pattern silicon during the fabrication of semiconductor devices. As the size of semiconductor devices decreases, traditional optical lithography becomes limited for patterning purposes due to the wave-length size of the electromagnetic radiation used to image the pattern. For example, by reducing the pitch of the images, the contrast is also reduced. Additionally, resolution achievable by the imaging radiation is directly proportional to the imaging radiation's wavelength.

Also, optical lithography techniques have been aggressively pushed to print features with dimensions having smaller and smaller fractions of the printing wavelength. This, in turn, results in smaller and smaller process windows, expensive use of assist features with questionable benefit and extendability, as well as linewidth control, particularly at gate definition, which consumes larger portions of device tolerances. This is unacceptable from a design standpoint. It is thus becoming increasingly more difficult to achieve projected performance and density projections.

One illustration clearly shows these problems. At gate level, lithography targets must be almost twice the desired final image size, necessitating dry-etch image size shrinking ("trims") to shrink the images. The trims are nesting-sensitive and pattern-sensitive adding further to a lack of tolerance control.

Because imaging size will ultimately be limited by the inherent limitations of the imaging radiation in lithographic techniques, other techniques to pattern a semiconductor device have been developed. For example, sidewall image transfer ("SIT") techniques have been developed, which is an edge printing process using the edges of a mask for imaging purposes. Accordingly, SIT methods allow a reduction in size of patterns without a size limitation imposed by imaging radiation.

However, current SIT methods suffer from pattern density issues and are known to magnify defects because the materials used in SIT imaging will coat all sides of debris on the surface to be imaged thereby magnifying the size of the debris. Additionally, current SIT methods can have poor control and thus make it difficult to image small objects with repeatable dimensions.

SUMMARY OF THE INVENTION

In a first aspect of the invention, an imaging method includes depositing a memory material on a substrate and memorizing a first edge and a second edge of the memory layer. The first and second edges define a loop of well-controlled sub-lithographic image size of memory material for image transfer.

In another aspect of the invention, an imaging method includes depositing a memory material on a substrate and protecting the memory material with a sacrificial layer. The method further includes defining a first edge in the memory layer and protecting other portions of the memory layer. The sacrificial layer is partially and controllably removed to define the second edge in the memory layer.

In yet another aspect of the invention, an imaging method includes depositing a sacrificial material on a substrate and depositing a capping material on the sacrificial material. The method of this aspect further includes removing corresponding sections of the capping material and sacrificial material and then forming an overhang of capping material. Imaging material is provided under the overhang of capping material and the capping material is removed with the sacrificial material thereby defining a first and second memorized edge which is transferred into an underlying layer.

DETAILED DESCRIPTION OF EMBODIMENTS OF THE INVENTION

Figure 1:
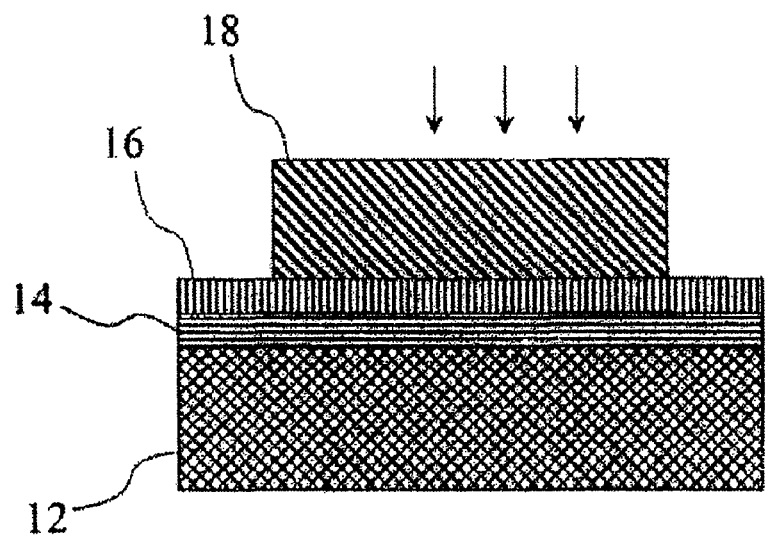
FIGS. 1-6 illustrates a first embodiment of the invention.

The invention is directed to employing non-critical lithographic techniques using a memory layer of material to memorize edges of a masking material to define a final structure having improved tolerances. In embodiments of the invention, the method relies on a novel use of chemical oxide removal (COR) processes to define an entire image. COR offers the advantages of being insensitive to surface debris, and can be employed to produce structures of highly repeatable and uniform dimensions. The COR processes employed by the invention is used to directly to produce narrow precisely controlled line-width, which eliminates the need for image size trimming (e.g., shrinkage). In the methods of the invention, thus, minimum device linewidths (and other critical linewidths) can be directly built without dependence on photolithographic tolerances.

The COR process described herein has been tested and evaluated and have been found to have no pattern sensitivity and no loading effect, as well as demonstrating Angstrom level etch control. The latter advantage being due, in part, by the self-limiting nature of the COR process. Additionally, since the COR process described herein works on the edge of a lithographically defined mandrel (oxide based layer), frequency doubling of the pitch is possible. Accordingly, the processes described herein are defect insensitive, are independent of any imaging radiation wavelength, and produce structures with highly repeatable dimensions.

COR is a plasma-free/damage-free chemical etch which is used to etch $SiO_2$-based materials. The COR process exploits the chemical reaction between solid $SiO_2$ and gaseous $NH_3$ & HF at room temperature (~25 C) and <15 mTorr pressure. This reaction produces ammonium hexafluorosilicate on the surface of the $SiO_2$ according to the chemical equation:

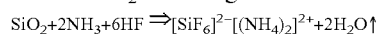
$$SiO_2 + 2NH_3 + 6HF \Rightarrow [SiF_6]^{2-}[(NH_4)_2]^{2+} + 2H_2O\uparrow$$

The deposition and subsequent buildup of the solid ammonium hexafluorosilicate by-product on all exposed $SiO_2$ surfaces leads to a diffusion limited reaction regime, as the gaseous reactants have to diffuse through the by-product layer to the reaction site, thereby slowing the reaction rate. The etch rate can be controlled by addition of Ar diluent, or changing reaction temperature or overall gaseous reaction pressure. By running in the diffusion-limited regime, the wafer-to-wafer reproducibility and within-wafer uniformity of the $SiO_2$ removal are excellent. In addition, there are no etch loading effects from local or global pattern densities and pitch of the etched structures, a common problem with plasma etch trimming.

Etch amounts of Ozone TEOS between 10 Å and 120 Å have been demonstrated. Once the COR is complete, the ammonium hexafluorosilicate by-product can be removed by either a standard DI water rinse, or alternatively by a thermal decomposition of the by-products at ~100° C. into three gaseous byproducts: $SiF_4$, HF and $NH_3$, which are then pumped away leaving a clean $SiO_2$ surface. TEOS etches of 550 Å have been demonstrated through multiple COR cycles. The COR process is also photoresist-compatible, and capping the hard mask with photoresist for a single COR etch has been successfully demonstrated.

Figure 4:
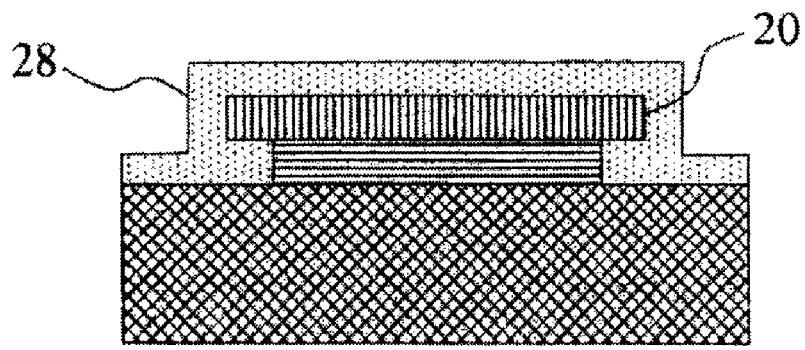
Figure 5:
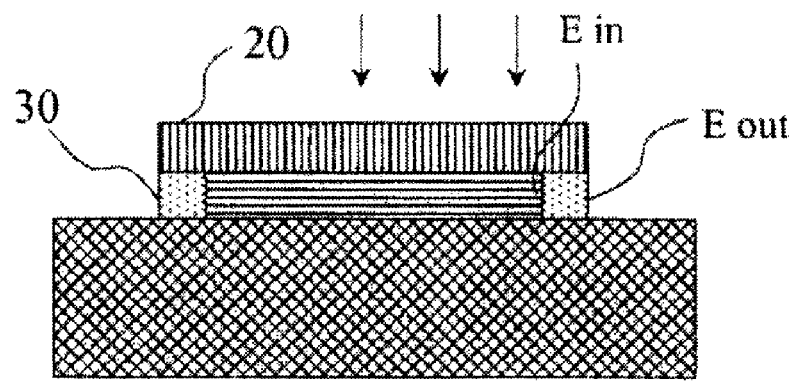
Figure 6:
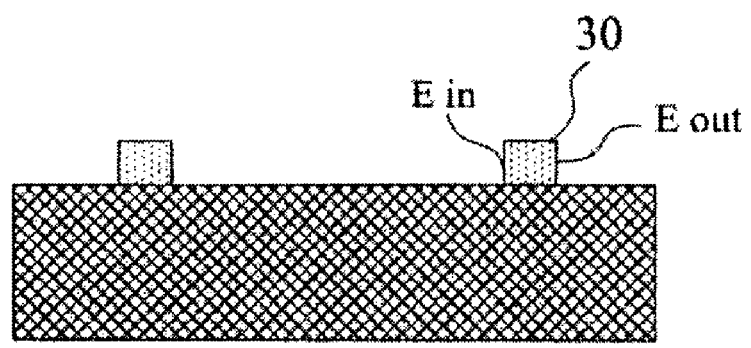

FIGS. 1-6 show steps in an embodiment of a non-critical lithographic patterning technique in accordance with the invention. FIG. 6 is the final structure (pattern) formed using the processes described herein.

Referring to FIG. 1, a substrate 12 is formed of any material appropriate for the substrate of the device being formed such as a polycrystalline silicon. An oxide layer 14 is formed on the substrate 12. The oxide layer 14 may be formed of any $SiO_2$-based material, for example. Additionally, the oxide layer 14 may be deposited by any of the oxide deposition methods well known in the art. A diffusion-block or chemical-block 16 is formed on top of the oxide layer 14, in any known manner.

In one embodiment, the chemical-block 16 should be of a material which will withstand or survive subsequent etching steps in the formation processes such as, for example, germanium (Ge) or organic materials. The height of the chemical-block 16 may vary, driven by etch selectivity; however, in one embodiment, a germanium (Ge) layer may be in the range of about 300 Å to 400 Å.

The chemical-block material 16 is used to memorize or copy a first edge of the final structure as defined by a resist layer 18. The resist layer 18 is printed, imaged and patterned, on top of the chemical-block 16, leaving exposed regions of the chemical-block 16.

Figure 2:
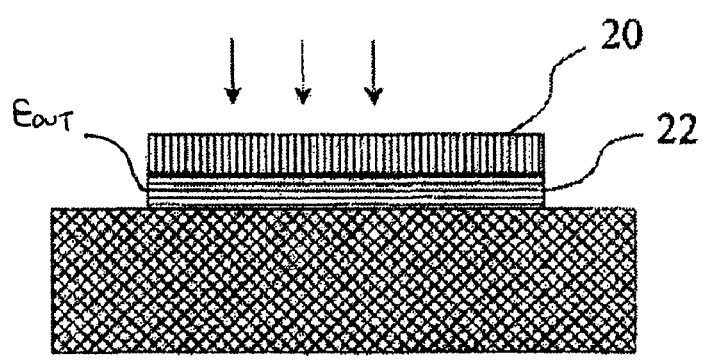

FIG. 2 shows a structure in accordance with the invention after etching processes. In particular, the chemical-block 16 and underlying oxide layer 14 are removed by a selective directional etching process. In one implementation, a standard reactive ion etching (RIE) may be used in which the resist layer 18 acts as a RIE mask. In this process, the chemical-block 16 and oxide layer 14 are etched (with the resist layer 18 acting as a mask) and then the resist layer 18 is stripped. By way of one example, a standard oxide etch based on chlorine ($Cl_2$) or hydrogen bromide (HBr) may be used to selectively etch the chemical-block 16. In another etching process, a fluorine-based etch may be used to etch away the oxide ($SiO_2$) layer 14, to the substrate 12. It should be understood that the chemical-block 16 such as Ge may be used to "firm" up the edge, which will be transferred to the $SiO_2$ layer as shown at $E_{out}$.

Still referring to FIG. 2, as a result of the etching process, the chemical-block layer 16 has been patterned and now forms a capping material, referred to as a hardmask 20. Additionally, the oxide layer 14 has also been patterned with the image of the photo resist 18 forming a sacrificial layer 22.

Figure 3:
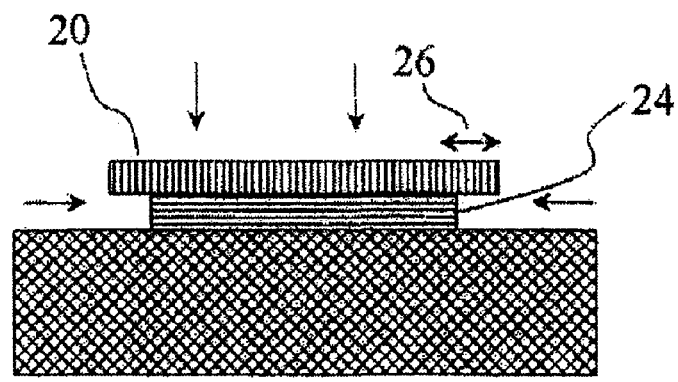

Referring to FIG. 3, after the hardmask 20 and the sacrificial material 22 are formed, an undercut 24 is formed in the sacrificial material 22 and beneath the hardmask 20. The edge of the hardmask 20 does not move during the undercut process, and the edge $E_{out}$ is thus memorized for use in subsequent steps. The undercut 24 is preferably formed by a chemical oxide removal (COR); however, a buffered HF etch may also be used to form the undercut. The width of undercut 24 corresponds to the desired final well-controlled linewidth. In one implementation, the COR process provides an undercut in the range of 50 Å to 500 Å. In one embodiment, a 300 Å undercut may be provided for Semiconductor Industry roadmap 65 nm-generation processing. It should be understood, that the COR process is repeatable and, as such, the undercut can be repeated to fabricate larger dimensions. Also, other dimensions are contemplated by the invention, depending on the desired linewidth of the final structure.

In one exemplary embodiment, the amount of undercut removal is determined by the COR process parameters (temperature, pressure and reactive concentration). For example, varying the temperature will vary the undercut depth. This COR process results in a solid by-product which is removed by sublimation or $H_2O$ wash to complete the COR cycle. The undercut 24 leaves an overhang 26 of the hardmask 20, comprising Ge, for example. The exposed substrate layer 12 is material to be later etched in accordance with the invention.

Referring to FIG. 4, after the undercut 24 is formed, a memory material such as a nitride layer 28, for example, is conformally formed over the hardmask 20, within the undercut 24 and over the exposed substrate layer 12. The nitride layer 28 will be used as a memory material in accordance with the invention to pattern the critical film. And, although nitride is preferred, this material may include any suitable material, for example, polycrystalline silicon or tungsten. The material deposited underneath the overhang 26 within the undercut 24 preferably has good conformality and gap-filling properties to fully fill the undercut 24. The memory material such as the nitride may be conformally deposited using, for example, silane and ammonia, or plasma enhanced chemical vapor deposition (CVD) process. Additionally, the nitride, for example, is capable of masking the etch employed to pattern the critical film (substrate) in later processing steps as described below.

In FIG. 5, a directional RIE process is used to remove selected portions (e.g., unprotected) of the nitride layer 28. This process should not remove the capping material 20, although portions of the capping material 20 may be sacrificed if the thickness of the capping material 20 remaining after RIE processing is sufficient to maintain a well-defined edge $E_{out}$. The directional RIE process is controlled to ensure that the edges of the material remain intact, e.g., are not eroded. The capping layer 20, during this RIE process, protects the inner edge $E_{in}$ of the nitride layer 28 and defines the outer edge $E_{out}$ in the nitride layer 28. Both edges $E_{out}$ and $E_{in}$ are thus memorized. If the edge of the capping material such as Ge is eroded during the RIE, then the edge of the nitride 28 will also be damaged, thus sacrificing the patterning of the final structure.

Still referring to FIG. 5, a germanium and oxide etch is then performed to selectively remove the capping layer 20 and the oxide layer 22, respectively. This etching process may be any standard wet chemical etching process or RIE to remove, for example, the Ge layer. One such process may include a solution of hydrogen peroxide to strip the Ge capping layer 20. This etching process results in the structure of FIG. 6; that is, the nitride layer within the undercut 24 remains on the substrate 12. At this end stage, there is a very well defined loop of nitride, which has a memorized inner edge $E_{in}$ and an outer edge $E_{out}$. In this manner, the outside edge $E_{out}$ corresponds to the edge of the photoresist 18 and the inner edge $E_{in}$ corresponds to the furthest extent of the undercut, which was previously memorized.

As should now be understood, the process of this embodiment in accordance with the invention is designed to memorize one edge of the pattern and protect another edge of the pattern. By way of illustrations, still referring to FIG. 5, the inner edge $E_{in}$ is formed at the junction of the undercut and the nitride mask. However, the inner edge $E_{in}$ is protected by the hardmask material 20. For example, in one implementation, the Ge layer 20 protects the inner edge $E_{in}$ of the pattern during the etching process. Additionally, the outer edge $E_{out}$ is memorized by the edge of the Ge hardmask 20.

As can be seen in FIG. 6, the actual dimensions of the image 30 are formed independent of any lithographic patterning methods. In the embodiment, rather than lithographic patterning methods, the image 30 is dimensioned based on COR or other oxide etching techniques. Accordingly, etching techniques that are easily controlled and provide uniform surfaces for forming the undercut 24 may be incorporated into the fabrication process.

An advantage of this method is that a tall vertical profile of the capping layer 20 and the oxide layer 22 is not required to form the final image. Additionally, in the COR processes thus described, there is no amplification of image defects because the final size of the image is constrained by the dimensions of the undercut and etching. Accordingly, an image of the edge is formed using a subtractive process which does not magnify defects and which is of sub-lithographic size.

FIGS. 7-13 show an alternate embodiment in accordance with the invention. As with to the embodiment of FIGS. 1-6, the embodiment of FIGS. 7-13 utilizes a COR process which exhibits better control over the image.

Figure 7:
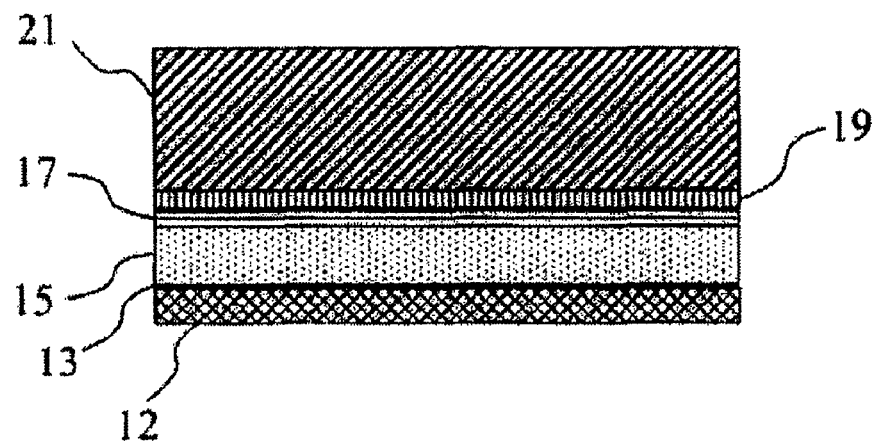
FIGS. 7-13 illustrates a second embodiment of the invention.

For example, starting in FIG. 7, an initial structure is formed in accordance with well-known methods. By way of illustration, a gate dielectric layer 13 is formed on the substrate 12. A gate polycrystalline silicon layer 15 is then formed on the gate dielectric layer 13, and preferably deposited thereon. A nitride layer 17 is then formed on the gate polysilicon layer 15. Nitride layer 17 acts as a hardmask. A memory layer 19 is formed on the nitride layer 17 and, in one implementation, may be polycrystalline silicon. It should be understood, though, that the memory layer 19 may be any suitable material which will resist etching process used to remove an upper oxide-like layer 21 such as an $SiO_2$-based material used for the COR process.

Figure 8:
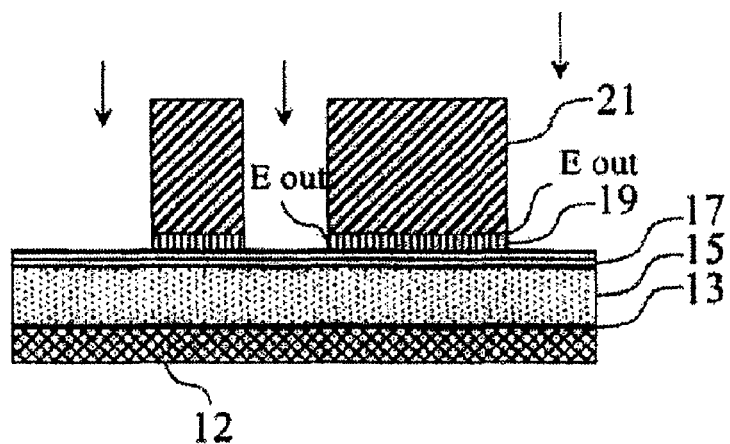

Referring to FIG. 8, the oxide-like layer 21 is anisotropically etched using a standard RIE process. For example, in one embodiment, the oxide-like layer 21 may be etched using a standard reactive ion etching (RIE) comprising a fluorine chemistry. In this manner, the outer edge $E_{out}$ can now be defined and memorized in the memory layer 19. $E_{out}$ will be later transferred to the nitride layer 17.

In FIG. 8, the memory layer 19 is also etched using a standard RIE, for example, using a chlorine or HBr chemistry. In this manner, the outer edge $E_{out}$ can now be defined in memory layer 19. $E_{out}$ will be modified and later transferred to the nitride layer 17 and then to the polycrystalline silicon layer 15. It should be understood that the etching process used in this process should not erode the underlying nitride layer, which will be later used to define the final image. Additionally, it should be recognized that this process can be implemented simultaneously for one or more stack structures, as shown representatively throughout FIGS. 8-13 to image more than one loop structure.

Figure 9:
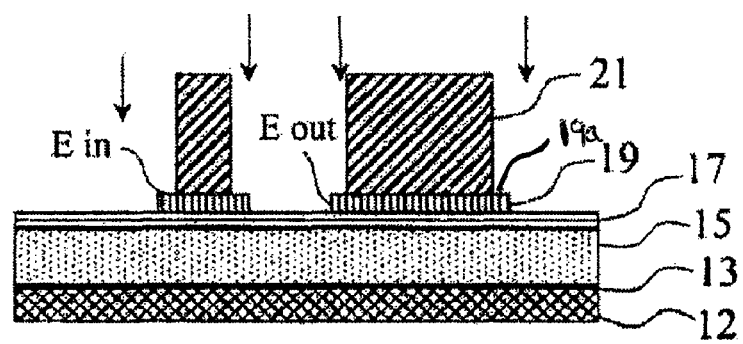

In FIG. 9, the oxide-like layer 21 is further etched to move the edge of oxide-like layer 21 from $E_{out}$ to $E_{in}$. In one embodiment, the oxide edge can be moved in the range of approximately 50 Å to 500 Å employing the COR process or other isotropic oxide etch. In the COR process, the greater dimensions may require multiple COR cycles. In one embodiment, the edge of the oxide-like layer 21 is moved approximately 300 Å for a 65 nm-generation process. In this process, the etching away of further oxide-like layer 21 on the sidewalls is used to define the inner edge $E_{in}$ of the final image. It should be understood that the etching process used in this process step should not erode the edges of the memory layer 19, which is used as an imaging layer. Accordingly, the memory layer 19 remains unetched, e.g., exposed on its edges, leaving a shoulder 19a. This step may also be accomplished using COR process or HF-based oxide etch, for example.

In this embodiment, an innermost portion of the shoulder 19a defines the memorized inner edge $E_{in}$ that will be transferred to the underlying layer. That is, a memorized edge is defined at the junction of the memory layer 19 and the oxide layer (mandrel) 21, as discussed below.

Figure 10:
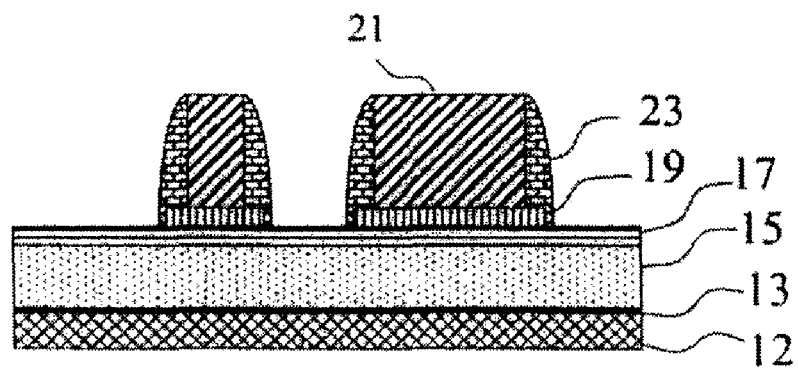

Now, in FIG. 10, spacers 23 are formed on the sidewall of the remaining oxide-like layer 21, the exposed region of the memory layer 19 and the portions of the underlying nitride layer 17, adjacent the outer edge $E_{out}$. The width of the spacer must be sufficient that the outer edge $E_{out}$ is covered and protected against later processing steps. The spacers 23 are, in one embodiment, formed of Ge film using a conformal deposition CVD process using $GeH_4$ gas. In this embodiment, the height "H" of the stack (memory layer and oxide layer) is approximately 1000 Å to 1500 Å to allow proper formation of the spacers 23.

It should be understood that the spacers 23 may be formed of any material which will survive a subsequent etching process to remove the underlying layers, discussed below. The spacers 23 are also required to be thick enough to cover or protect the outer edge $E_{out}$ of memory layer 19 while the process memorizes the inner edge $E_{in}$ in the underlying layer. For example, in one embodiment, the thickness of the spacer 23 is approximately 20 nm to 100 nm; although other thicknesses are also contemplated by the invention depending on the desired final dimensions of the image.

Although not critical to the understanding of the invention, the material thicknesses of the above structure may vary depending on many variables such as etching parameters and the desired dimensions of the final structure. But for illustrative purposes, critical dimensions used in accordance with one embodiment of the invention depends on the image size and may include:

(i) an approximate height of the oxide-like layer 21 in the range of 1000 Å to 1500 Å for a 300 Å image;

(ii) an approximate height of the memory layer 19 in the range of 200 Å to 400 Å, independent of the undercut; and (iii) an approximate height of the spacer in the range of two to four times the width at a base.

Figure 11:
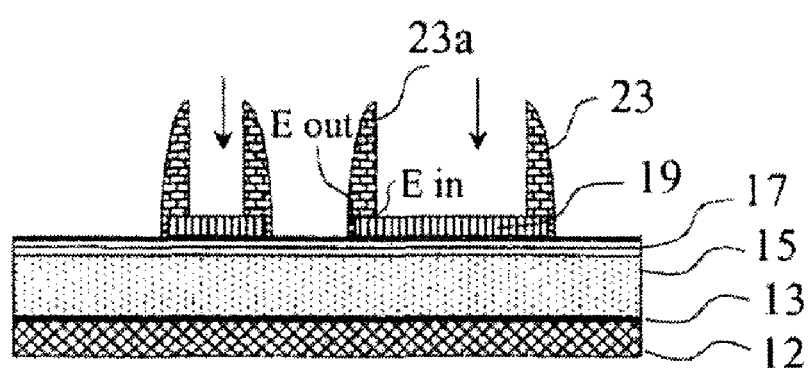

FIG. 11 is representative of an etching process for stripping of the oxide-like layer 21, which was acting as a mandrel layer between the spacers 23. In this process, the oxide material may be stripped using a standard wet hydrofluoric (HF) acid, for example. This process leaves intact the spacers 23, while protecting the outer edge $E_{out}$ of the image and exposing the inner surface 23a of the spacers 23. The inner surfaces 23a of the spacers 23 will define the inner edge $E_{in}$, which is subsequently memorized into the memory layer 19.

Figure 12:
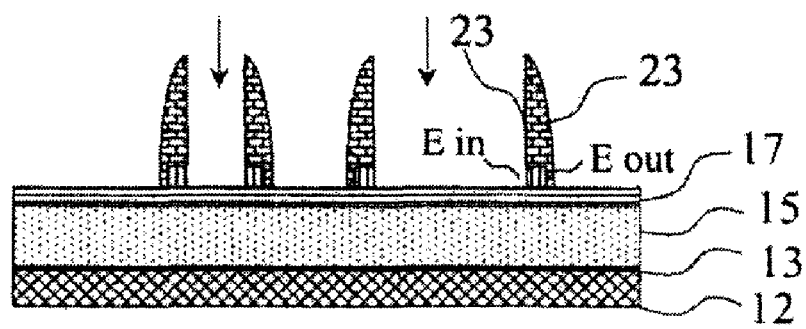

In FIG. 12, the polycrystalline silicon or memory layer 19, between the inner surfaces of the spacers 23, is etched using any standard RIE process. For example, this etching process, as discussed above, may be a standard RIE process using a chlorine or HBr chemistry. The outer edge $E_{out}$ remains protected by the spacer 23.

Figure 13:
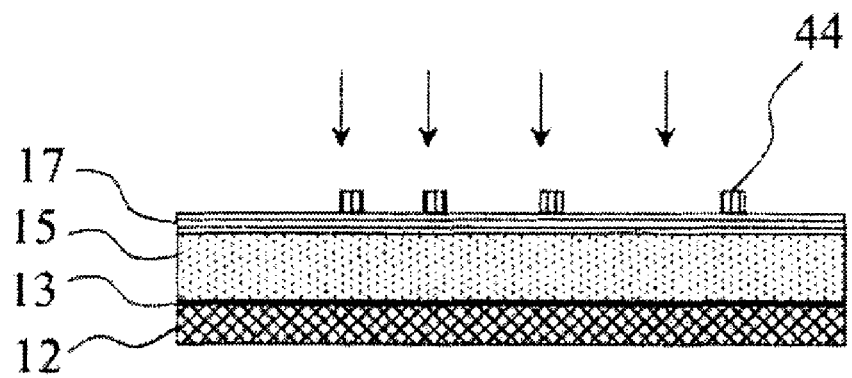

In FIG. 13, the spacers 23 are stripped using a standard process such as a wet etching process. For example, a hydrogen peroxide solution may be used to strip the spacers 23 if they are germanium. Remaining is the underlying image 44, which includes the memorized edges $E_{in}$ and $E_{out}$. The result is a loop of nitride having well-defined width, which can be used in later processing steps to define a portion of the structure. Additionally, it should be understood that further etching processes could be used to cut the loop at desired locations.

FIGS. 14-22 shows steps in accordance with another embodiment of the invention. In this embodiment, a organic layer is used instead of the spacer shown in FIGS. 7-13. In the embodiment of FIGS. 14-22, the height of the oxide-like layer 21 is independent of the etched amount and can thus be significantly reduced in height; whereas, in the embodiment of FIGS. 7-13, the height of the oxide layer is dependent on the spacer height which, in turn, is dependent on the etched amount. Therefore, the height of the oxide layer in FIGS. 7-13 is increased in order to provide for the processes therein. In this manner, a tall mandrel layer is not required in the embodiment of FIGS. 14-22; a tall mandrel is necessary to achieve required spacer control during the etching process. For example, in the embodiment of FIGS. 14-22, the oxide layer may be as small as 50 Å and may be in the range of approximately 50 Å to 1000 Å.

Figure 14:
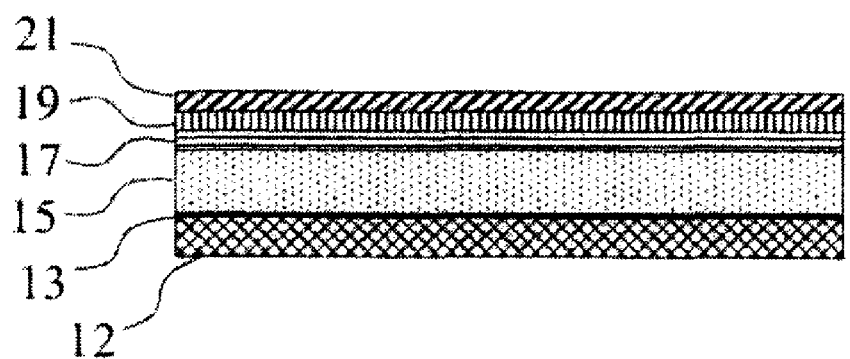
FIGS. 14-22 illustrates a third embodiment of the invention.

Referring now to FIG. 14, a gate dielectric layer 13 is formed on the substrate 12. A gate polycrystalline silicon layer 15 is then deposited on the gate dielectric layer 13. A nitride layer 17 is then formed on the gate polycrystalline silicon layer 15. Nitride layer 17 is used as a hardmask in later processing steps. A memory layer 19 is formed on the nitride layer 17 and, in one implementation, may be polycrystalline silicon. It should be understood, though, that the memory layer 19 may be any suitable material which will resist etching process used to remove an upper $SiO_2$-based layer 21.

The height of particular constituent components of the structure of FIG. 14 may vary depending on many variables such as etching parameters and the desired dimensions of the final structure. But for illustrative purposes, the oxide-like layer 21 may be in the range of approximately 300 Å to 400 Å and the memory layer 19 may be in the range of approximately 200 Å to 300 Å.

Figure 15:
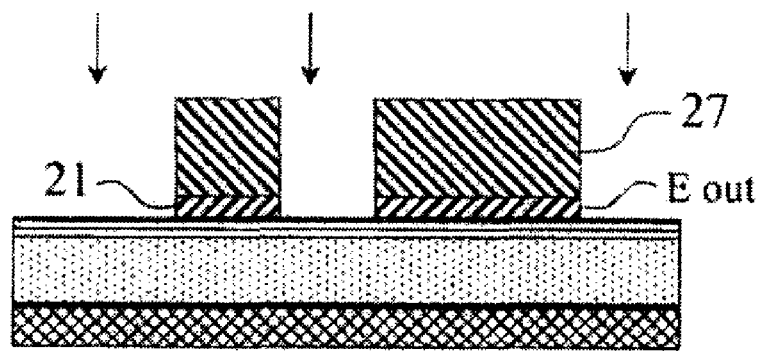

Referring to FIG. 15, a resist layer 27 is placed over the oxide-like layer 21 in order to pattern the oxide-like layer 21 and is then used to protect the top of the oxide-like layer 21 during a subsequent etching process. The exposed portions of the oxide-like layer 21 are then etched using a standard RIE process, as discussed above. This etching process exposes the outer edge $E_{out}$, which is subsequently memorized in the memory layer 19.

Figure 16:
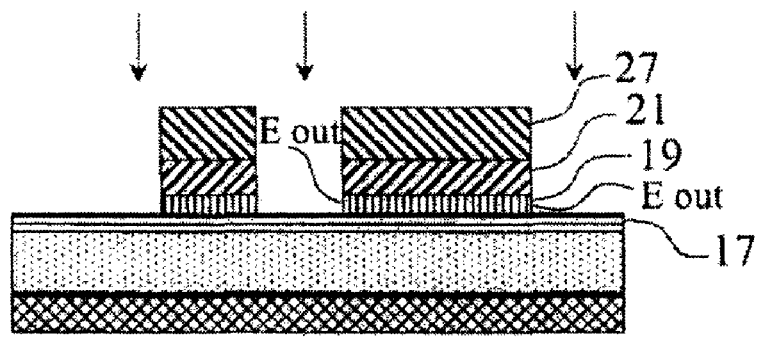
Figure 17:
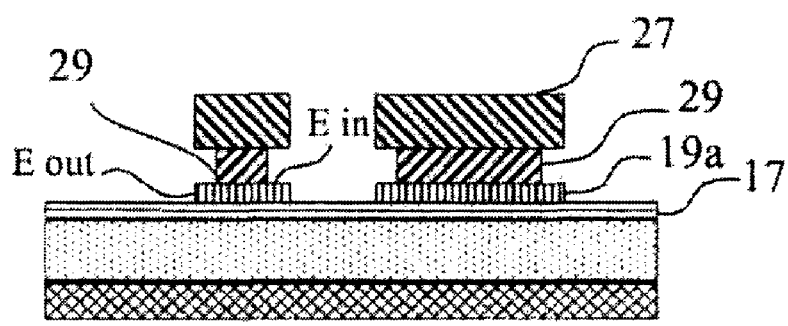

FIG. 16 shows an etching of the memory layer 19 in order to obtain the outer edge $E_{out}$. The etching of the memory layer 19 may be a chlorine-based RIE, for example. FIG. 17 shows a lateral etch to remove selected portions (e.g., unprotected) of the oxide-like layer 21, forming an undercut 29. In one preferred process, a COR process is used to etch the oxide-like layer 21. This process should preserve the edges of the underlying memory layer 19.

Also, the process step(s) representative of FIG. 17 should preferably not remove the resist layer 27, although portions of the resist layer 27 may be sacrificed. The resist layer 27 on top of the oxide layer 21 also acts as a etch block for etching in the vertical direction, thereby further reducing the oxide-like layer thickness and increasing the overall imaging process accuracy and precision. The COR process is used to control the depth of the undercut to form a shoulder 19a in the memory layer 19. In this manner, the inner edge $E_{in}$ may be memorized in the memory layer 19. In one implementation, the undercut is at a depth of approximately 50 Å to 500 Å, although other dimensions are equally contemplated by the invention depending on the desired final dimensions of the structure.

Figure 18:
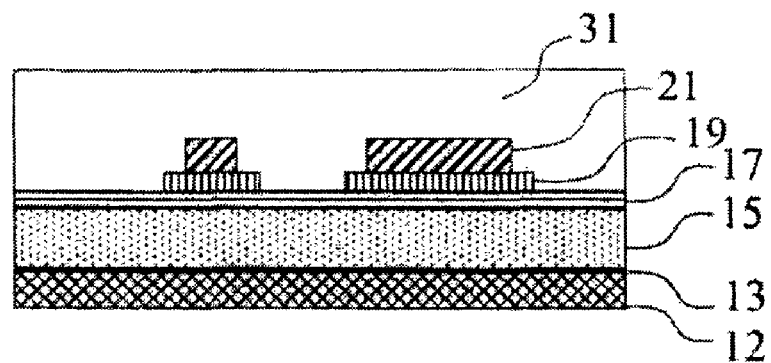

FIG. 18 shows the resist layer 27 stripped using any conventional stripping method. In one implementation, the stripping process will not erode the nitride layer 17, the undercut oxide-like layer 21 or the memory layer 19. A spin on organic material or CVD Ge is then formed over the entire structure, as represented schematically as reference numeral 31. This material 31 may be any material capable of protecting the outer edge $E_{out}$ during subsequent etching steps.

Figure 19:
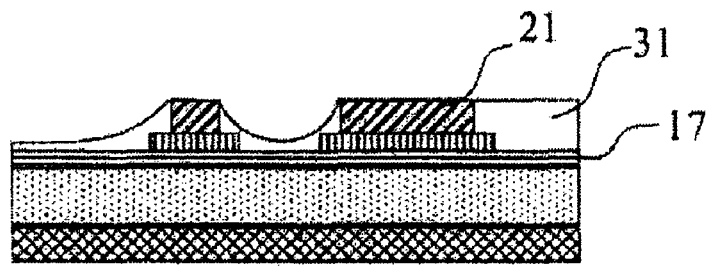

In FIG. 19, a dry etch or polishing step is provided. In this step, the dry etch may be selective to the oxide-like layer 21 and performed on the spin-on organic material. The polishing step may be used with the spin-on organic material or the Ge material. In this processing step, a top portion of the oxide-like layer 21 is now exposed; although the memory layer 19 remains protected by the remaining organic overlay material 31. This remaining material 31 will protect the outer edge $E_{out}$.

Figure 20:
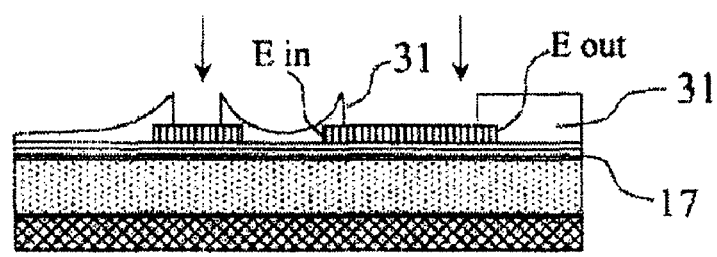

Referring to FIG. 20, an oxide etch is then performed to selectively remove the oxide-like layer 21, completely. Accordingly, the oxide-like layer 21 may be referred to as a sacrificial layer. This etching process may be any standard wet chemical etching process or RIE to remove, for example, the oxide layer. In one embodiment, a fluorine-based etch may be used to strip away the oxide-like layer 21, to the memory layer 19. This process will expose the inner edge $E_{in}$ over the memory layer; whereas, the outer edge $E_{out}$ remains protected under the organic material 31.

Figure 21:
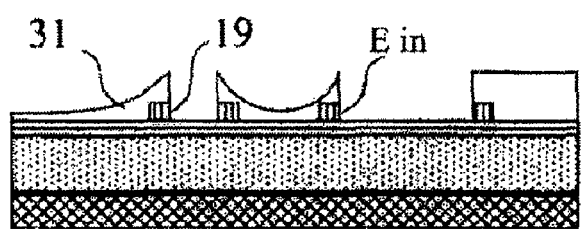

In the step of FIG. 21, the memory layer 19 is now etched to memorize or transfer the inner edge $E_{in}$, previously located as the vertical edge of material 31, into the layer 17. The outer edge $E_{out}$ remains protected by the organic layer 31.

Figure 22:
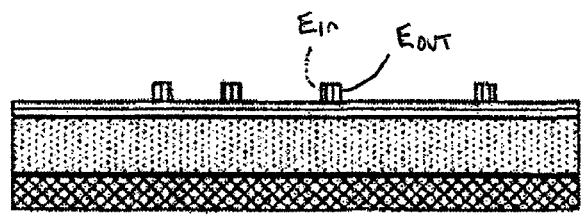

In FIG. 22, the remaining portions of the organic layer 31 are stripped by using a plasma strip, for example. If the layer 31 is an Ge layer, then a stripping process using hydrogen peroxide may be utilized to remove this layer. This etching process results in the structure of FIG. 22; that is, the COR-defined edge images in the layer 17 has a memorized inner edge $E_{in}$ and outer edge $E_{out}$, in a well defined loop of nitride. As in the previous embodiments, further conventional processes may be used to form a device.

As should now be understood in view of the above detailed description of the invention, the actual dimensions of the image are formed independent of any lithographic patterning methods. In the embodiments, rather than lithographic patterning methods, the image is dimensioned based on etching techniques. Additionally, in the COR processes thus described, an image of the edge is formed using a subtractive process which does not magnify defects. Additionally, the processes described herein are highly repeatable.

While the invention has been described in terms of exemplary embodiments, those skilled in the art will recognize that the invention can be practiced with modifications and in the spirit and scope of the appended claims.

What is claimed is:

1. An imaging method, comprising the steps of:
    depositing a memory layer on a substrate;
    memorizing a first edge of the memory layer; and
    memorizing a second edge of the memory layer by undercutting a sacrificial layer under the memory layer to define a loop of sub-lithographic well-controlled image size of memory material for image transfer.

2. The imaging method of claim 1, further comprising memorizing the first edge and second edge in an underlying material to form a sub-lithographic image.

3. The imaging method of claim 1, further comprising protecting a location of the second edge while memorizing the first edge.

4. The imaging method of claim 1, wherein the memorized second edge is defined at a junction between the memory layer and the sacrificial layer.

5. The imaging method of claim 4, further comprising undercutting the sacrificial layer by one of chemical oxide removal and hydrofluoric acid to define the location of the second edge.

6. The imaging method of claim 1, wherein the memorized first edge is defined by an edge of an upper layer comprising of Ge or organic spin-on material.

7. An imaging method, comprising the steps of:
depositing a memory layer on a substrate;
memorizing a first edge of the memory layer;
memorizing a second edge of the memory layer to define a loop of sub-lithographic well-controlled image size of memory material for image transfer;
patterning an oxide layer formed over the memory layer;
etching the memory layer to define the memorized first edge using the patterned oxide layer to determine a first edge location;
removing portions of the oxide layer and the memory layer between a spacer to form the memorized second edge, the spacer protecting the memorized first edge and copying the location of the second edge; and;
stripping the spacer to define the second edge and the well-controlled loop of sub-lithographic image size of memory material for image transfer.

8. The imaging method of claim 7, further comprising transferring the memorized first image and the memorized second image to an underlying material.

9. The imaging method of claim 7, further comprising stripping further portions of the oxide layer over the memory layer to move an edge of the oxide layer and to locate the second edge prior to the formation of the memorized second edge.

10. An imaging method, comprising the steps of:
depositing a memory layer on a substrate;
memorizing a first edge of the memory layer;
memorizing a second edge of the memory layer to define a loop of sub-lithographic well-controlled image size of memory material for image transfer;
providing a resist layer over an oxide material formed on the memory layer;
etching the oxide material and portions of the memory layer in a pattern formed by the resist layer, the etching forms the memorized first edge;
etching an undercut in the oxide material using a chemical oxide removal (COR) process or hydrofluoric acid to form a shoulder in the memory layer partially defining the second edge;
stripping the resist layer to expose the oxide layer;
placing protective material over the exposed portions of the oxide layer and the shoulder of the memory layer to protect the first edge;
partially removing the protective material so as to leave it between closely-spaced oxide material features, thereby protecting the first-edge but exposing the oxide layer,
etching the exposed oxide layer to memorize the second edge; and
removing the protective material in order to define an image to be transferred onto an underlying layer, as defined by the memorized first edge and second edge.

11. An imaging method, comprising:
depositing a memory layer on a substrate;
protecting the memory layer with a protective layer;
defining a first edge in the memory layer and protecting other portions of the memory layer with the protective layer which are to be formed as a second edge by forming an undercut; and
removing a portion of the protective layer to define the second edge in the memory layer.

12. The imaging method of claim 11, further comprising transferring the image formed by the first edge and the second edge to an underlying layer.

13. An imaging method, comprising:
depositing a memory layer on a substrate;
protecting the memory layer with a protective layer;
defining a first edge in the memory layer and protecting other portions of the memory layer with the protective layer which are to be formed as a second edge; and
removing a portion of the protective layer to define the second edge in the memory layer;
forming the undercut in the protective layer using a chemical oxide removal (COR) process;
conformally forming the memory layer over the protective layer and in the undercut;
etching the memory layer to form the first edge while the protective layer over the undercut protects the second edge; and
stripping the protective layer and an underlying sacrificial layer to define the second edge.

14. An imaging method, comprising:
depositing a memory layer on a substrate;
protecting the memory layer with a protective layer;
defining a first edge in the memory layer and protecting other portions of the memory layer with the protective layer which are to be formed as a second edge; and
removing a portion of the protective layer to define the second edge in the memory layer;
stripping a portion of a sacrificial layer formed over the memory layer to define the first edge, the sacrificial layer being the protective layer;
stripping further portions of the sacrificial layer over the memory layer using a chemical oxide removal or a hydrofluoric acid to form a shoulder in the memory layer;
forming a spacer over the shoulder and portions of an underlying layer, adjacent to remaining portions of the sacrificial layer;
stripping the remaining portions of the sacrificial layer and the memory layer between the spacers to form the memorized second edge, the spacer protecting the memorized first edge; and
stripping the spacer to define a well-controlled loop of memory material.

15. The imaging method of claim 14, wherein stripping portions of the sacrificial layer comprises selectively removing a portion of the sacrificial layer.

16. An imaging method, comprising:
depositing a memory layer on a substrate;
protecting the memory layer with a protective layer;
defining a first edge in the memory layer and protecting other portions of the memory layer with the protective layer which are to be formed as a second edge; and
removing a portion of the protective layer to define the second edge in the memory layer;
providing a resist layer over the sacrificial layer;
etching the sacrificial layer and portions of the memory layer in a pattern formed by the resist layer, the etching forms the memorized first edge while the sacrificial layer protects edge erosion;

etching an undercut in the sacrificial layer using a chemical oxide removal (COR) or selective controlled etch process to form an undercut;

placing a gap-fill material over exposed portions of the sacrificial layer and within the undercut to protect the first edge;

etching the exposed sacrificial layer to memorize the second edge; and removing the gap-fill material in order to define an image to be transferred onto an underlying layer as defined by the first edge and the second edge.

17. An imaging method, comprising;

depositing a sacrificial material on a substrate;

depositing a capping material on the sacrificial material;

removing corresponding sections of the capping material and sacrificial material;

forming an overhang of the capping material;

depositing imaging material under the overhang of the capping material; and removing the capping material and the sacrificial material, thereby forming a first defined memorized edge and a second defined memorized edge having a sub-lithographic image size.

18. The imaging method of claim 17, wherein depositing the imaging material under the overhang of the capping material comprises depositing the imaging material on the capping material, sacrificial material and substrate, and etching the imaging material using the capping material as a mask.

19. The imaging method of claim 17, wherein forming an overhang of the capping material comprises removing a portion of the sacrificial material under the capping material.

20. The imaging method of claim 17, wherein forming an overhang of the capping material comprises removing sacrificial material using one of a chemical oxide removal and hydrofluoric acid.

* * * * *

UNITED STATES PATENT AND TRADEMARK OFFICE
CERTIFICATE OF CORRECTION

PATENT NO. : 7,585,614 B2　　　　　　　　　　　　　　　　　　　　　　Page 1 of 1
APPLICATION NO. : 10/711458
DATED : September 8, 2009
INVENTOR(S) : Furukawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1388 days.

Signed and Sealed this

Fourteenth Day of September, 2010

David J. Kappos
*Director of the United States Patent and Trademark Office*